(12) United States Patent
Jin et al.

(10) Patent No.: US 10,547,029 B2
(45) Date of Patent: Jan. 28, 2020

(54) OLED PACKAGE STRUCTURE

(71) Applicant: Wuhan China Star Optoelectronics Technology Co., Ltd., Wuhan (CN)

(72) Inventors: Jiangjiang Jin, Wuhan (CN); Hsianglun Hsu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/285,126

(22) Filed: Feb. 25, 2019

(65) Prior Publication Data
US 2019/0189964 A1   Jun. 20, 2019

Related U.S. Application Data

(63) Continuation-in-part of application No. 15/505,116, filed on Feb. 20, 2017, now Pat. No. 10,283,732.

(30) Foreign Application Priority Data

Dec. 15, 2016   (CN) .......................... 2016 1 1163660

(51) Int. Cl.
*H01L 29/08*   (2006.01)
*H01L 51/52*   (2006.01)
*C23C 14/04*   (2006.01)
*H01L 51/56*   (2006.01)

(52) U.S. Cl.
CPC .......... *H01L 51/5256* (2013.01); *C23C 14/04* (2013.01); *H01L 51/56* (2013.01)

(58) Field of Classification Search
CPC ..... H01L 51/52; H01L 51/5256; H01L 51/56; H01L 51/5253; H01L 51/5237
See application file for complete search history.

(56) References Cited

U.S. PATENT DOCUMENTS

| | | | |
|---|---|---|---|
| 2007/0117257 A1* | 5/2007 | Kim ........................ | H01L 27/12 438/99 |
| 2014/0077187 A1* | 3/2014 | Lee ..................... | H01L 51/5281 257/40 |
| 2014/0132148 A1* | 5/2014 | Jang .................... | H01L 51/5246 313/504 |
| 2014/0191204 A1* | 7/2014 | Jeong ................... | H01L 27/322 257/40 |
| 2015/0228923 A1* | 8/2015 | Schicktanz ......... | H01L 51/5246 257/40 |

(Continued)

*Primary Examiner* — Phuc T Dang
(74) *Attorney, Agent, or Firm* — Leong C. Lei

(57) ABSTRACT

An OLED package structure includes a first outer bound confinement layer formed on an OLED device, a first outer bound confinement layer arranged on the first inorganic layer and enclosing and delimiting a confinement space, a first organic layer formed on the first inorganic layer in the confinement space, and a second inorganic layer arranged on the first organic layer and the first outer bound confinement layer, such that a peripheral portion of the second inorganic layer is positioned on and supported by the first outer bound confinement layer and a central portion of the second inorganic layer is partly received in the confinement space to have a bottom of the second inorganic layer positioned on and contacting a top of the first organic layer.

6 Claims, 5 Drawing Sheets

(56) References Cited

U.S. PATENT DOCUMENTS

2016/0043340 A1* 2/2016 Ohara ................ H01L 51/5253
257/40
2018/0355181 A1* 12/2018 Yoon .................... C09B 69/106

* cited by examiner

OLED PACKAGE STRUCTURE

CROSS REFERENCE TO RELATED APPLICATIONS

This is a continuation-in-part application of co-pending patent application Ser. No. 15/505,116, filed on Feb. 20, 2017, which is a national stage of PCT Application Number PCT/CN2016/113037, filed on Dec. 29, 2016, claiming foreign priority of Chinese Patent Application Number 201611163660.7, filed on Dec. 15, 2016.

BACKGROUND OF THE INVENTION

1. Field of the Invention

The present invention relates to the field of display technology, and more particular to an OLED packaging method and an OLED package structure.

2. The Related Arts

Organic light-emitting display (OLED) possesses various advantages, such as being self-luminous, low drive voltage, high luminous efficiency, short response time, high clarity and contrast, almost 180° view angle, wide range of operation temperature, and easy realization of flexible displaying and large-area full-color displaying, and is considered the most promising display device in the industry.

Based on the way of driving, OLEDs can be classified in two categories, passive matrix OLED (PMOLED) and active matrix OLED (AMOLED), namely two categories of direct addressing and TFT array addressing, among which the AMOLED comprises pixels that are arranged in an array and belongs to an active display type, having high light emission performance and being commonly used in high definition large-sized display devices.

An OLED device is generally made up of a substrate, an anode arranged on the substrate, a hole injection layer arranged on and anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of the OLED device is that when a semiconductor material and an organic light emission material are driven by an electric field, carrier currents are injected and re-combine to cause emission of light. Specifically, the OLED device often uses an indium tin oxide (ITO) electrode and a metal electrode to respectively serve as anode and cathode of the device and electrons and holes, when driven by a predetermined electrical voltage, are respectively injected into the electron transport layer and the hole transport layer from the cathode and the anode such that the electrons and the holes respectively migrate through the electron transport layer and the hole transport layer to get into the emissive layer and meet in the emissive layer to form excitons to excite light emissive molecules to emit light, the later undergoing radiation relaxation to give off visible light.

OLED based flat panel displaying and lighting fields recently attract wide attention of the scientific research and academic community. Particularly, in the recent years, flexible OLED display panels that exhibit wide future prosperity are now emerging and become the focus of competition among the major panel manufacturers. The flexible OLED display device may readily generate cracking during a curving or folding process so as to introduce external moisture and oxygen therein thereby degrading organic light emitting materials and reducing the service life of the OLED devices. Currently, the most widely used flexible thin film encapsulation (TFE) generally involves an inorganic layer/organic layer/inorganic layer alternating structure, wherein the inorganic layers function to block moisture and oxygen, while the organic layer functions to release stresses. A rollable OLED display device, as an ultimate goal, imposes more strict requirements for thin film encapsulation structure, for the smaller the curving radius, the more easily it is possible to realize rollable displaying.

Currently, in the inorganic layer/organic layer/inorganic layer alternating flexible thin film package structure, coating of the organic layer often adopts an ink jet printing (IJP) method that exhibits better precision and higher efficiency. An worldwide famous IJP manufacturer, Kateeva, discloses, in U.S. Patent Application Serial No. 2014/0233843, an IJP pixel printing technique, in which during ink jetting, a bank that is higher than a thickness of the printing material inside the pixel area must be formed outside the pixel area to suppress spreading of the jetted printing liquid. However, the formation of the bank increases an operation step in manufacturing a substrate and often lacks the capability of blocking external moisture and oxygen.

Seoul National University of Korea discloses, in U.S. Patent Application Serial No. 2015/0042346, an OLED package structure, in which the thin-film encapsulation structure adopts multiple inorganic layer/organic layer alternating structure, wherein coating of the organic layer is achieved with flash evaporation, ink jet printing, or slot die coating. However, the patent document lacks details concerning thickness of coating, viscosity of monomers of organic materials, and manufacturing processes. If the coating of the organic layer is conducted with flash evaporation, ink jet printing, or slot die coating, then it is quite doubtful concerning the feasibility of forming a thin film encapsulation structure that has a homogeneous thickness and is rollable.

SUMMARY OF THE INVENTION

Objectives of the present invention are to provide an OLED packaging method, which helps reduce curving radius of an OLED package structure, realizes rollable displaying having a reduced curving radius, and also provides an OLED package structure so formed having a more powerful moisture and oxygen blocking capability and an extended service life.

Objectives of the present invention are also to provide an OLED package structure, which can realize rollable displaying having a reduced curving radius, and also have a more powerful moisture and oxygen blocking capability and an extended service life.

To achieve the above objectives, the present invention provides an OLED packaging method, which comprises the following steps:

Step 1: providing a OLED device and forming a first inorganic layer on the OLED device such that the first inorganic layer covers the OLED device;

Step 2: forming an organic photoresist layer on the first inorganic layer;

Step 3: subjecting the organic photoresist layer to exposure and development such that a developed and removed portion of the organic photoresist layer defines an outer bound confinement area on the first inorganic layer;

Step 4: depositing a dense material layer on the organic photoresist layer and the outer bound confinement area of the first inorganic layer, such that the dense material layer has a thickness less than a thickness of the organic photoresist layer to form a substrate-to-be-peeled-off;

Step 5: dipping the substrate-to-be-peeled-off, in the entirety thereof, in a photoresist peeling solution so as to remove the organic photoresist layer and at the same time peel off a portion of the dense material layer that is located on the organic photoresist layer in combination with the organic photoresist layer, while preserving a portion of the dense material layer that is located on the outer bound confinement area of the first inorganic layer to form a first outer bound confinement layer;

Step 6: coating an organic material on an area of the first inorganic layer that is enclosed by the first outer bound confinement layer such that the organic material so coated has a thickness less than a thickness of the first outer bound confinement layer so as to form a first organic layer; and Step 7: forming a second inorganic layer on the first organic layer and the first outer bound confinement layer.

In Step 4, plasma enhanced chemical vapor deposition, atomic layer deposition, pulsed laser deposition, sputtering, or vapor deposition is applied to deposit the dense material layer; the dense material layer is formed of a material comprising one or multiple ones of diamond-like carbon, zirconium aluminate, graphene, silver, aluminum, aluminum nitride, and copper; and the dense material layer has a thickness of 0.5 µm-3 µm.

In Step 6, spin coating, screen printing, slot spin coating, dispensing, or ink jet printing is applied to form the first organic layer; the first organic layer is formed of a material comprising one or multiple ones of acrylic, hexamethyldisiloxane, polyacrylate, polycarbonate, and polystyrene; and the first organic layer has a thickness of 0.5 µm-3 µm.

Optionally, the OLED packaging method further comprises Step 8: forming a plurality of package units on the second inorganic layer in a stacked manner such that the package units each comprise an second outer bound confinement layer, a second organic layer arranged inside the second outer bound confinement layer on an area enclosed by the second outer bound confinement layer, and a third inorganic layer arranged on the second outer bound confinement layer and the second organic layer, wherein the second organic layer has a thickness less than a thickness of the second outer bound confinement layer.

The stacked arrangement of the plurality of package units comprises at least one package unit;

the second outer bound confinement layer is formed with a process similar to that of the first outer bound confinement layer, the second outer bound confinement layer being set at a location corresponding vertically to a location of the first outer bound confinement layer, the second outer bound confinement layer having a material and a thickness identical to those of the first outer bound confinement layer; and the second organic layer is formed with a process similar to that of the first organic layer, the second organic layer having a material and a thickness identical to those of the first organic layer.

The present invention also provides an OLED package structure, which comprises an OLED device, a first inorganic layer arranged on the OLED device and covering the OLED device, a first outer bound confinement layer arranged on the first inorganic layer and enclosing and delimiting a confinement space, a first organic layer arranged on the first inorganic layer in an area enclosed by the first outer bound confinement layer, and a second inorganic layer arranged on the first organic layer and the first outer bound confinement layer, wherein the first organic layer has a thickness less that a thickness of the first outer bound confinement layer, and wherein a peripheral portion of the second inorganic layer has a bottom that is positioned on and supported by a top of the first outer bound confinement layer and a central portion of the second inorganic layer has a lower part that is received in the confinement space, a bottom of the lower part of the second inorganic layer being positioned on a top of the first organic layer.

The first outer bound confinement layer is formed of a material comprising one or multiple ones of diamond-like carbon, zirconium aluminate, graphene, silver, aluminum, aluminum nitride, and copper; and the first outer bound confinement layer has a thickness of 0.5 µm-3 µm.

The first organic layer is formed of a material comprising one or multiple ones of acrylic, hexamethyldisiloxane, polyacrylate, polycarbonate, and polystyrene; and the first organic layer has a thickness of 0.5 µm-3 µm.

Optionally, the OLED package structure further comprises: a plurality of package units arranged on the second inorganic layer in a stacked manner, the package units each comprising a second outer bound confinement layer, a second organic layer arranged inside the second outer bound confinement layer and enclosed by the second outer bound confinement layer, and a third inorganic layer arranged on the second outer bound confinement layer and the second organic layer, wherein the second organic layer has a thickness less than a thickness of the second outer bound confinement layer.

The stacked arrangement of the plurality of package units comprises at least one package unit;

the second outer bound confinement layer is set at a location that corresponds vertically to a location of the first outer bound confinement layer, the second outer bound confinement layer having a material and a thickness identical to those of the first outer bound confinement layer; and the second organic layer has a material and a thickness identical to those of the first organic layer.

The present invention further provide an OLED package structure, which comprises an OLED device, a first inorganic layer arranged on the OLED device and covering the OLED device, a first outer bound confinement layer arranged on the first inorganic layer and enclosing and delimiting a confinement space, a first organic layer arranged on the first inorganic layer in an area enclosed by the first outer bound confinement layer, and a second inorganic layer arranged on the first organic layer and the first outer bound confinement layer, wherein the first organic layer has a thickness less that a thickness of the first outer bound confinement layer, and wherein a peripheral portion of the second inorganic layer has a bottom that is positioned on and supported by a top of the first outer bound confinement layer and a central portion of the second inorganic layer has a lower part that is received in the confinement space, a bottom of the lower part of the second inorganic layer being positioned on a top of the first organic layer;

wherein the first outer bound confinement layer is formed of a material comprising one or multiple ones of diamond-like carbon, zirconium aluminate, graphene, silver, aluminum, aluminum nitride, and copper; and the first outer bound confinement layer has a thickness of 0.5 µm-3 µm; and wherein the first organic layer is formed of a material comprising one or multiple ones of acrylic, hexamethyldisiloxane, polyacrylate, polycarbonate, and polystyrene; and the first organic layer has a thickness of 0.5 μm-3 μm.

The efficacy of the present invention is that the present invention provides an OLED packaging method, in which a first outer bound confinement layer is first formed and then, a first organic layer is formed on the first inorganic layer in an area enclosed by the first outer bound confinement layer so that facilities for forming the first organic layer can be diversified and an organic material used to form the first organic layer is not subjected to constraint in respect of viscosity thereof, whereby using an organic material with a reduced viscosity allows for better homogeneity of the first organic layer, the thickness reduced, and thus helping reduce a curving radius of the OLED package structure to realize rollable displaying with a reduced curving radius. Further, the first outer bound confinement layer helps block external moisture and oxygen from corroding the first organic layer in a sideway direction so that the OLED package structure so manufactured exhibits better capability for blocking moisture and oxygen and extended service life. The present invention provides an OLED package structure, which allows for realization of rollable displaying with a reduced curving radius and also exhibits better capability for blocking moisture and oxygen and extended service life.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
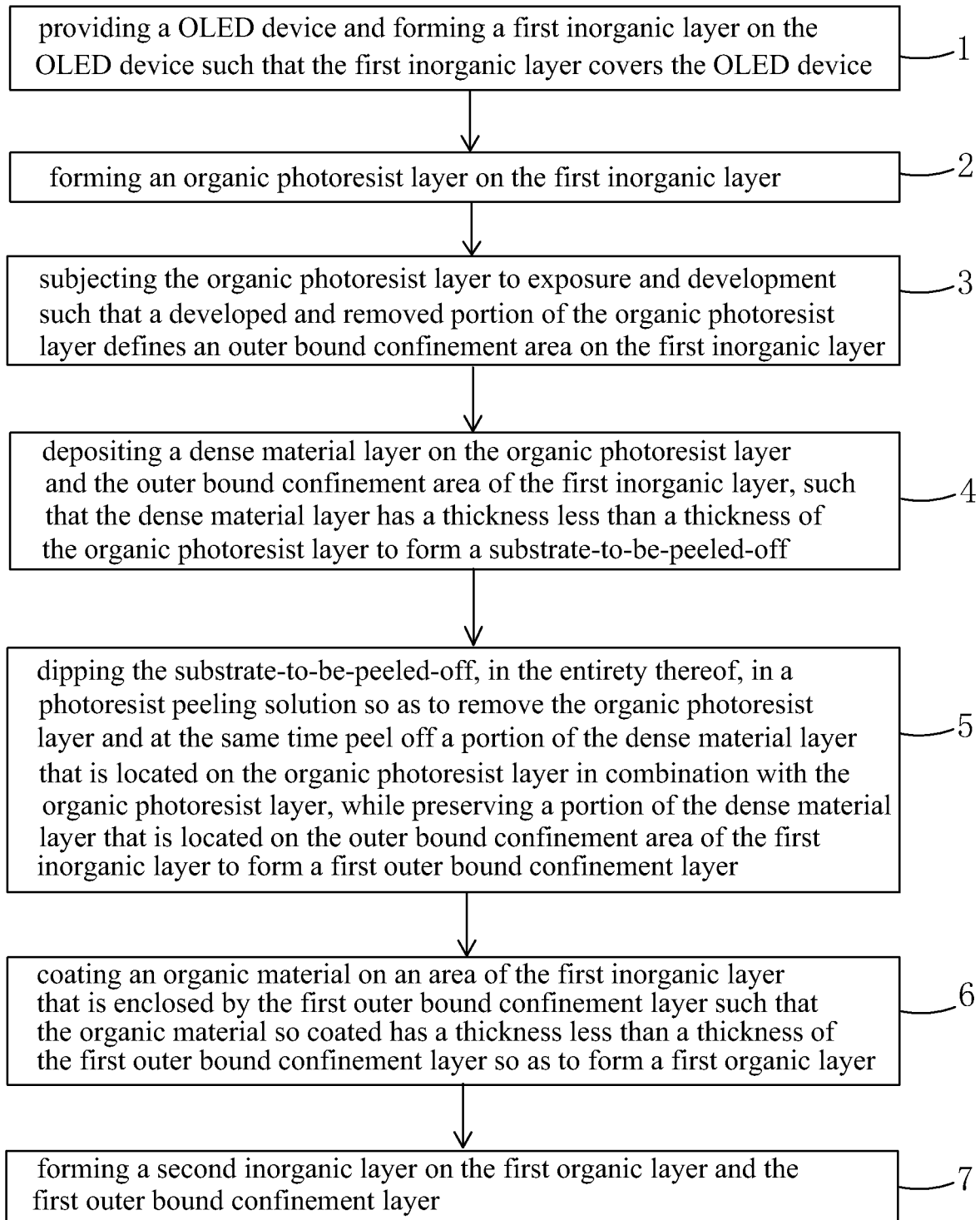
FIG. 1 is a flow chart illustrating an OLED packaging method according to the present invention.
Figure 2:
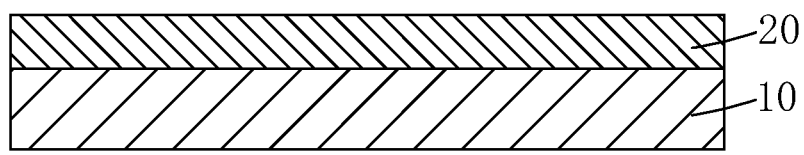
FIG. 2 is a schematic view illustrating Step 1 of the OLED packaging method according to the present invention.

Referring to FIG. 1, the present invention provides an OLED packaging method, which comprises the following steps:

Step 1: as shown in FIG. 2, providing an OLED device 10 and forming a first inorganic layer 20 on the OLED device 10 such that the first inorganic layer 20 covers the OLED device 10.

Specifically, in Step 1, plasma enhanced chemical vapor deposition, atomic layer deposition, pulsed laser deposition, sputtering, or vapor deposition is applied to form the first inorganic layer 20.

Specifically, the first inorganic layer 20 is formed of a material comprising one or multiple ones of aluminum oxide ($Al_2O_3$), zinc peroxide ($ZnO_2$), titanium dioxide ($TiO_2$), silicon nitride ($SiN_x$), silicon carbonitride ($SiCN_x$), silicon oxide ($SiO_x$), zirconium oxide ($ZrO_2$), and aluminum nitride (AlN); and the first inorganic layer 20 has a thickness of 0.5 μm-1 μm. The first inorganic layer 20 functions to block moisture and oxygen from corroding the OLED device 10.

Figure 3:
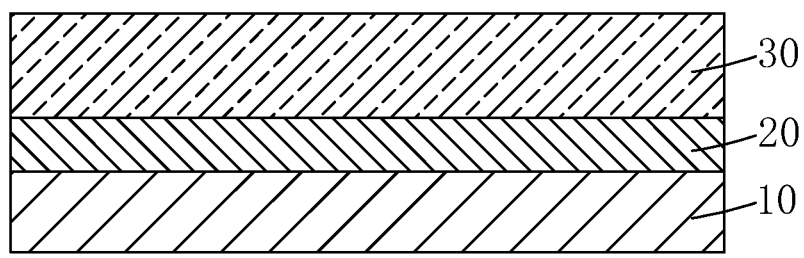
FIG. 3 is a schematic view illustrating Step 2 of the OLED packaging method according to the present invention.

Step 2: as shown in FIG. 3, forming an organic photoresist layer 30 on the first inorganic layer 20.

Specifically, in Step 2, spin coating, screen printing, slot coating, dispensing, or ink jet printing is applied to form the organic photoresist layer 30.

Specifically, the organic photoresist layer 30 is formed of a material comprising negative organic photoresist; and the organic photoresist layer 30 has a thickness of 0.5 μm-3 μm. The thickness of the organic photoresist layer 30 constrains a thickness range of a first outer bound confinement layer 45 that is formed subsequently.

Figure 4:
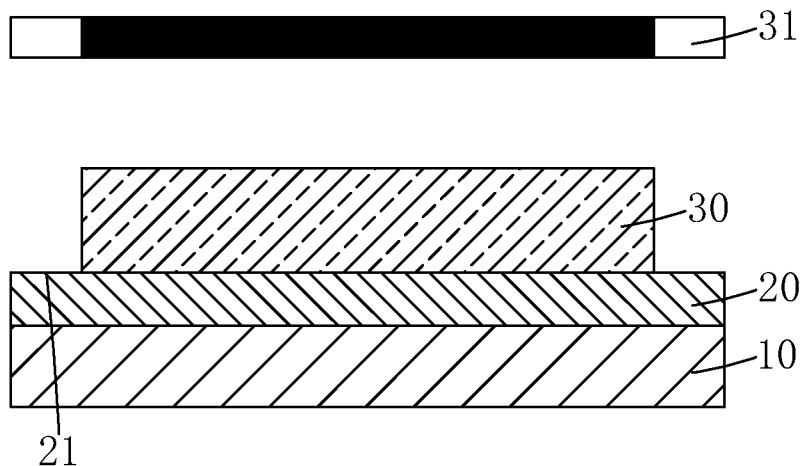
FIG. 4 is a schematic view illustrating Step 3 of the OLED packaging method according to the present invention.

Step 3: as shown in FIG. 4, using a mask 31 to subject the organic photoresist layer 30 to exposure and development such that a developed and removed portion of the organic photoresist layer 30 defines an outer bound confinement area 21 on the first inorganic layer 20.

Figure 5:
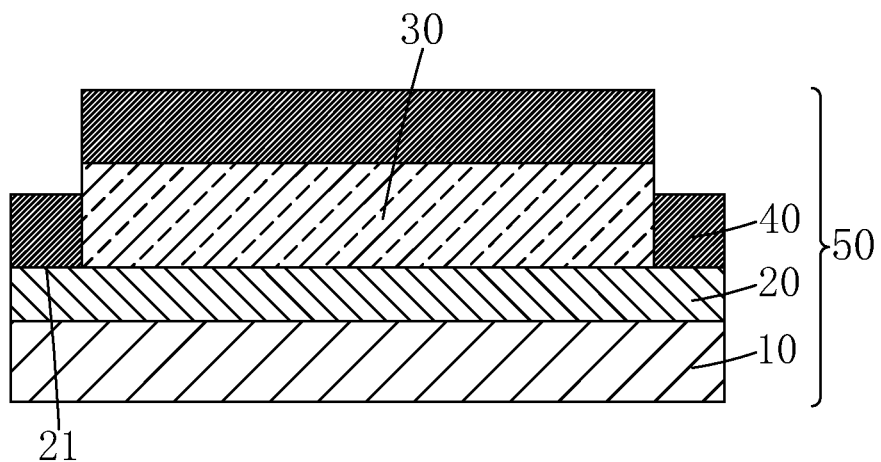
FIG. 5 is a schematic view illustrating Step 4 of the OLED packaging method according to the present invention.

Step 4: as shown in FIG. 5, depositing a dense material layer 40 on the organic photoresist layer 30 and the outer bound confinement area 21 of the first inorganic layer 20, such that the dense material layer 40 has a thickness less than a thickness of the organic photoresist layer 30 to form a substrate-to-be-peeled-off 50.

Specifically, in Step 4, plasma enhanced chemical vapor deposition, atomic layer deposition, pulsed laser deposition, sputtering, or vapor deposition is applied to deposit the dense material layer 40.

Specifically, the dense material layer 40 is formed of a material comprising one or multiple ones of diamond-like carbon (DLC), zirconium aluminate ($ZrAl_xO_y$), graphene, silver, aluminum, aluminum nitride, and copper; and the dense material layer 40 has a thickness of 0.5 μm-3 μm.

Figure 6:
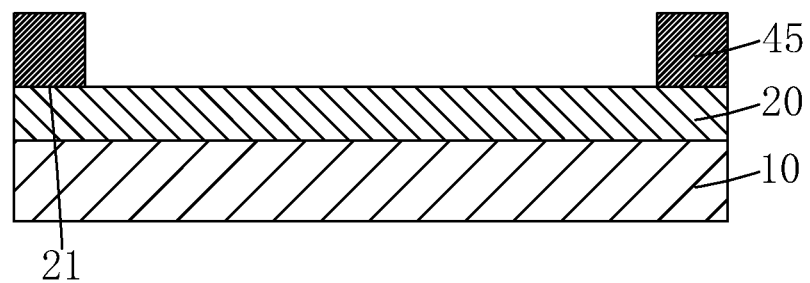
FIG. 6 is a schematic view illustrating Step 5 of the OLED packaging method according to the present invention.

Step 5: as shown in FIG. 6, dipping the substrate-to-be-peeled-off 50, in the entirety thereof, in a photoresist peeling solution so as to remove the organic photoresist layer 30 and at the same time peel off a portion of the dense material layer 40 that is located on the organic photoresist layer 30 in combination with the organic photoresist layer 30, while preserving a portion of the dense material layer 40 that is located on the outer bound confinement area 21 of the first inorganic layer 20 to form a first outer bound confinement layer 45.

Specifically, in Step 5, selectivity for selection of the photoresist peeling solution is such that peeling of the organic photoresist layer 30 can be achieved, while no damage may be caused on the first inorganic layer 20 and the OLED device 10.

Specifically, the photoresist peeling solution comprises an organic solvent.

Specifically, the first outer bound confinement layer 45 blocks external moisture and oxygen from corroding, in a sideway direction, a first organic layer 60 that will be formed in a subsequent operation.

Figure 7:
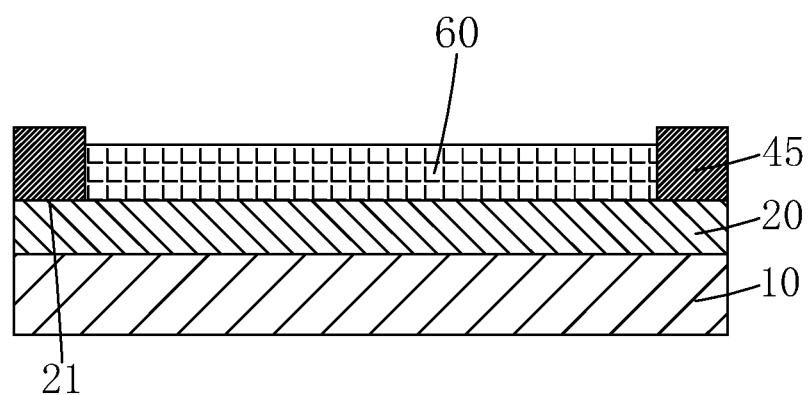
FIG. 7 is a schematic view illustrating Step 6 of the OLED packaging method according to the present invention.

Step 6: as shown in FIG. 7, coating an organic material on an area of the first inorganic layer 20 that is enclosed by the first outer bound confinement layer 45 such that the organic material so coated has a thickness less than a thickness of the first outer bound confinement layer 45 so as to form a first organic layer 60.

Specifically, in Step 6, spin coating, screen printing, slot spin coating, dispensing, or ink jet printing is applied to form the first organic layer 60. Since the thickness of the organic material so coated is less than the thickness of the first outer bound confinement layer 45, overflow can be prevented.

In the above Step 2 to Step 6, the present invention first forms the first outer bound confinement layer 45 and then forms the first organic layer 60 in the area of the first inorganic layer 20 that is enclosed by the first outer bound confinement layer 45. This provides advantages, such as (1) the coating operation of the organic material cab be performed with more diverse facilities; (2) the organic material used can be of a smaller viscosity and the smaller viscosity of the organic material allows for easy flowing and smooth spreading so as to achieve better uniformity of the first organic layer 60 so formed; (3) the thickness of the first organic layer 60 can be made thinner to facilitate realization of rollable displaying with a reduced curving radius; and (4) the first outer bound confinement layer 45 helps block external moisture and oxygen from corroding, in a sideway direction, the first organic layer 60.

Specifically, the first organic layer 60 is formed of a material comprising one or multiple ones of acrylic, hexamethyldisiloxane (HMDSO), polyacrylate, polycarbonate, and polystyrene. The first organic layer 60 has a thickness of 0.5 μm-3 μm. The first organic layer 60 provides functions for planarization and releasing stress.

Figure 8:
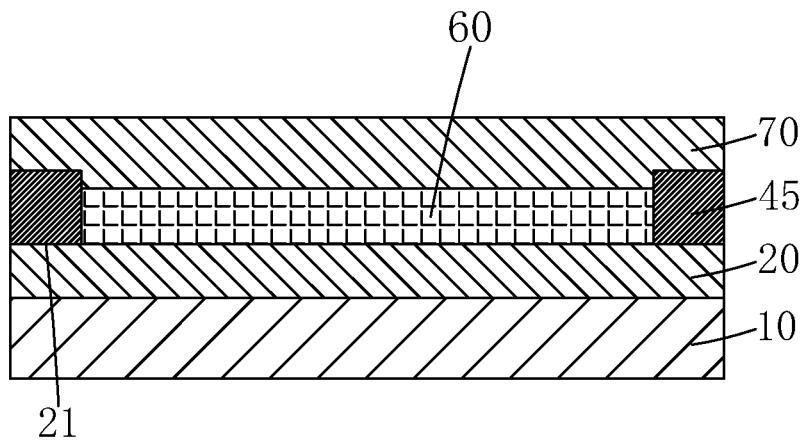
FIG. 8 is a schematic view illustrating Step 7 of the OLED packaging method according to the present invention and is also a schematic cross-sectional view of a first example of an OLED package structure according to the present invention.

Step 7: as shown in FIG. 8, forming a second inorganic layer 70 on the first organic layer 60 and the first outer bound confinement layer 45.

To this point, basic packaging of the OLED device 10 is completed.

Specifically, in Step 7, the second inorganic layer 70 is formed with a process that is similar to that of the first inorganic layer 20 and the second inorganic layer 70 has a material and a thickness identical to those of the first inorganic layer 20. Since the thickness of first organic layer 60 is less than the thickness of the first outer bound confinement layer 45, the second inorganic layer 70 that is formed on the first organic layer 60 and the first outer bound confinement layer 45 has a portion (such as a peripheral portion) that is supported on the first outer bound confinement layer 45 with a bottom of the second inorganic layer 70 positioned o and contacting a top of the first outer bound confinement layer 45, and another portion (such as a central portion) that is partly extended into the space confined by the first outer bound confinement layer 45 to have a bottom thereof contacting and thus positioned on and supported by a top of the first organic layer 60.

Figure 9:
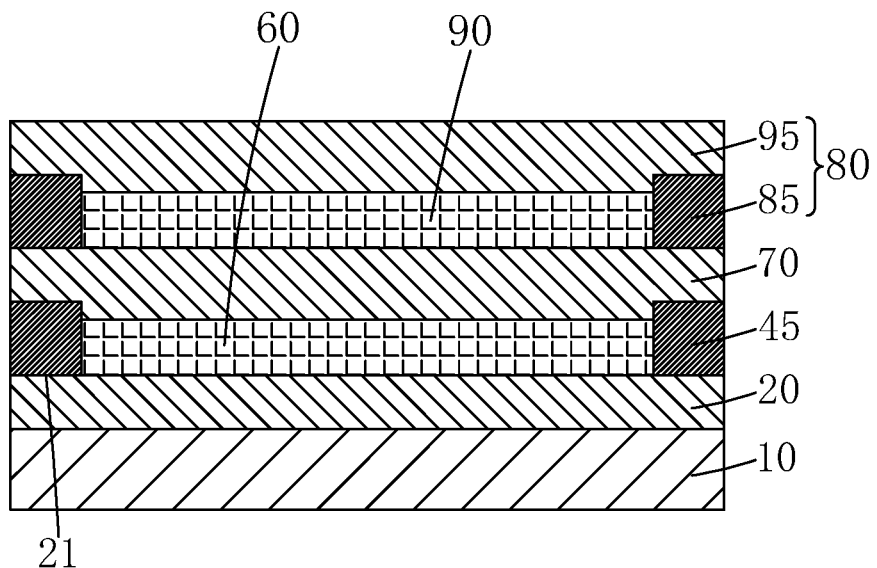
FIG. 9 is a schematic view illustrating Step 8 of the OLED packaging method according to the present invention and is also a schematic cross-sectional view of a second example of an OLED package structure according to the present invention.

Further, to enhance the effect of packaging of the OLED device 10, the OLED packaging method of the present invention may further comprises:

Step 8: as shown in FIG. 9, forming a plurality of package units 80 on the second inorganic layer 70 in a stacked manner such that the package units 80 each comprise an second outer bound confinement layer 85, a second organic layer 90 arranged inside the second outer bound confinement layer 85 on an area enclosed by the second outer bound confinement layer 85, and a third inorganic layer 95 arranged on the second outer bound confinement layer 85 and the second organic layer 90, wherein the second organic layer 90 has a thickness less than a thickness of the second outer bound confinement layer 85.

Specifically, as shown in FIG. 9, the stacked arrangement of the plurality of package units 80 comprises at least one package unit 80.

Specifically, the second outer bound confinement layer 85 is formed with a process similar to that of the first outer bound confinement layer 45 and the second outer bound confinement layer 85 is set at a location that corresponds vertically to a location of the first outer bound confinement layer 45 and the second outer bound confinement layer 85 has a material and a thickness identical to those of the first outer bound confinement layer 45.

Specifically, the second organic layer 90 is formed with a process similar to that of the first organic layer 60 and the second organic layer 90 has a material and a thickness identical to those of the first organic layer 60.

Specifically, the third inorganic layer 95 is formed with a process similar to that of the second inorganic layer 70 and the third inorganic layer 95 has a material and a thickness identical to those of the second inorganic layer 70.

In the above-described OLED packaging method, a first outer bound confinement layer 45 is first formed and then, a first organic layer 60 is formed on the first inorganic layer 20 in an area enclosed by the first outer bound confinement layer 45 so that facilities for forming the first organic layer 60 can be diversified and an organic material used to form the first organic layer 60 is not subjected to constraint in respect of viscosity thereof, whereby using an organic material with a reduced viscosity allows for better homogeneity of the first organic layer 60, the thickness reduced, and thus helping reduce a curving radius of the OLED package structure to realize rollable displaying with a reduced curving radius. Further, the first outer bound confinement layer 45 helps block external moisture and oxygen from corroding the first organic layer 60 in a sideway direction so that the OLED package structure so manufactured exhibits better capability for blocking moisture and oxygen and extended service life.

Referring to FIG. 8, based on the above-described OLED packaging method, the present invention also provides an OLED package structure, which comprises an OLED device 10, a first inorganic layer 20 arranged on the OLED device 10 and covering the OLED device 10, a first outer bound confinement layer 45 arranged on the first inorganic layer 20, a first organic layer 60 arranged on the first inorganic layer 20 in an area enclosed by the first outer bound confinement layer 45, and a second inorganic layer 70 arranged on the first organic layer 60 and the first outer bound confinement layer 45, wherein the first organic layer 60 has a thickness less that a thickness of the first outer bound confinement layer 45.

Specifically, the first inorganic layer 20 is formed of a material comprising one or multiple ones of aluminum oxide ($Al_2O_3$), zinc peroxide ($ZnO_2$), titanium dioxide ($TiO_2$), silicon nitride ($SiN_x$), silicon carbonitride ($SiCN_x$), silicon oxide (SiO$_x$), zirconium oxide (ZrO$_2$), and aluminum nitride (AlN); and the first inorganic layer 20 has a thickness of 0.5 μm-1 μm.

Specifically, the first outer bound confinement layer 45 is formed of a material comprising one or multiple ones of diamond-like carbon (DLC), zirconium aluminate (ZrAl$_x$O$_y$), graphene, silver, aluminum, aluminum nitride, and copper; and the first outer bound confinement layer 45 has a thickness of 0.5 μm-3 μm.

Specifically, the first organic layer 60 is formed of a material comprising one or multiple ones of acrylic, hexamethyldisiloxane (HMDSO), polyacrylate, polycarbonate, and polystyrene. The first organic layer 60 has a thickness of 0.5 μm-3 μm.

Specifically, the second inorganic layer 70 has a material and a thickness identical to those of the first inorganic layer 20.

Further, referring to FIG. 9, the OLED package structure of the present invention may further comprises: a plurality of package units 80 arranged on the second inorganic layer 70 in a stacked manner. The package units 80 each comprises a second outer bound confinement layer 85, a second organic layer 90 arranged inside the second outer bound confinement layer 85 and enclosed by the second outer bound confinement layer 85, and a third inorganic layer 95 arranged on the second outer bound confinement layer 85 and the second organic layer 90, wherein the second organic layer 90 has a thickness less than a thickness of the second outer bound confinement layer 85.

Specifically, as shown in FIG. 9, the stacked arrangement of the plurality of package units 80 comprises at least one package unit 80.

Specifically, the second outer bound confinement layer 85 is set at a location that corresponds vertically to a location of the first outer bound confinement layer 45 and the second outer bound confinement layer 85 has a material and a thickness identical to those of the first outer bound confinement layer 45.

Specifically, the second organic layer 90 has a material and a thickness identical to those of the first organic layer 60.

Specifically, the third inorganic layer 95 has a material and a thickness identical to those of the second inorganic layer 70.

In the above-described OLED package structure, a first outer bound confinement layer 45 is first formed and then, a first organic layer 60 is formed on the first inorganic layer 20 in an area enclosed by the first outer bound confinement layer 45 so that facilities for forming the first organic layer 60 can be diversified and an organic material used to form the first organic layer 60 is not subjected to constraint in respect of viscosity thereof, whereby using an organic material with a reduced viscosity allows for better homogeneity of the first organic layer 60, the thickness reduced, and thus helping reduce a curving radius of the OLED package structure to realize rollable displaying with a reduced curving radius. Further, the first outer bound confinement layer 45 helps block external moisture and oxygen from corroding the first organic layer 60 in a sideway direction so that the OLED package structure so manufactured exhibits better capability for blocking moisture and oxygen and extended service life.

In summary, the present invention provides an OLED packaging method and an OLED package structure. The OLED packaging method according to the present invention is such that a first outer bound confinement layer is first formed and then, a first organic layer is formed on the first inorganic layer in an area enclosed by the first outer bound confinement layer so that facilities for forming the first organic layer can be diversified and an organic material used to form the first organic layer is not subjected to constraint in respect of viscosity thereof, whereby using an organic material with a reduced viscosity allows for better homogeneity of the first organic layer, the thickness reduced, and thus helping reduce a curving radius of the OLED package structure to realize rollable displaying with a reduced curving radius. Further, the first outer bound confinement layer helps block external moisture and oxygen from corroding the first organic layer in a sideway direction so that the OLED package structure so manufactured exhibits better capability for blocking moisture and oxygen and extended service life. The OLED package structure according to the present invention allows for realization of rollable displaying with a reduced curving radius and also exhibits better capability for blocking moisture and oxygen and extended service life.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. An organic light-emitting display (OLED) package structure, comprising an OLED device, a first inorganic layer arranged on the OLED device and covering the OLED device, a first outer bound confinement layer arranged on the first inorganic layer and enclosing and delimiting a confinement space, a first organic layer arranged on the first inorganic layer in an area enclosed by the first outer bound confinement layer, and a second inorganic layer arranged on the first organic layer and the first outer bound confinement layer, wherein the first organic layer has a thickness less that a thickness of the first outer bound confinement layer, and wherein a peripheral portion of the second inorganic layer has a bottom that is positioned on and supported by a top of the first outer bound confinement layer and a central portion of the second inorganic layer has a lower part that is received in the confinement space, a bottom of the lower part of the second inorganic layer being positioned on a top of the first organic layer, and further comprising: a plurality of package units arranged on the second inorganic layer in a stacked manner, the package units each comprising a second outer bound confinement layer, a second organic layer arranged inside the second outer bound confinement layer and enclosed by the second outer bound confinement layer, and a third inorganic layer arranged on the second outer bound confinement layer and the second organic layer, wherein the second organic layer has a thickness less than a thickness of the second outer bound confinement layer.

2. The OLED package structure as claimed in claim 1, wherein the first outer bound confinement layer is formed of a material comprising one or multiple ones of diamond-like carbon, zirconium aluminate, graphene, silver, aluminum, aluminum nitride, and copper; and the first outer bound confinement layer has a thickness of 0.5 μm-3 μm.

3. The OLED package structure as claimed in claim 1, wherein the first organic layer is formed of a material comprising one or multiple ones of acrylic, hexamethyldisiloxane, polyacrylate, polycarbonate, and polystyrene; and the first organic layer has a thickness of 0.5 μm-3 μm.

4. The OLED package structure as claimed in claim 1 wherein the stacked arrangement of the plurality of package units comprises at least one package unit;

the second outer bound confinement layer is set at a location that corresponds vertically to a location of the first outer bound confinement layer, the second outer bound confinement layer having a material and a thickness identical to those of the first outer bound confinement layer; and the second organic layer has a material and a thickness identical to those of the first organic layer.

5. An organic light-emitting display (OLED) package structure, comprising an OLED device, a first inorganic layer arranged on the OLED device and covering the OLED device, a first outer bound confinement layer arranged on the first inorganic layer and enclosing and delimiting a confinement space, a first organic layer arranged on the first inorganic layer in an area enclosed by the first outer bound confinement layer, and a second inorganic layer arranged on the first organic layer and the first outer bound confinement layer, wherein the first organic layer has a thickness less that a thickness of the first outer bound confinement layer, and wherein a peripheral portion of the second inorganic layer has a bottom that is positioned on and supported by a top of the first outer bound confinement layer and a central portion of the second inorganic layer has a lower part that is received in the confinement space, a bottom of the lower part of the second inorganic layer being positioned on a top of the first organic layer; and further comprising: a plurality of package units arranged on the second inorganic layer in a stacked manner, the package units each comprising a second outer bound confinement layer, a second organic layer arranged inside the second outer bound confinement layer and enclosed by the second outer bound confinement layer, and a third inorganic layer arranged on the second outer bound confinement layer and the second organic layer, wherein the second organic layer has a thickness less than a thickness of the second outer bound confinement layer;

wherein the first outer bound confinement layer is formed of a material comprising one or multiple ones of diamond-like carbon, zirconium aluminate, graphene, silver, aluminum, aluminum nitride, and copper; and the first outer bound confinement layer has a thickness of 0.5 μm-3 μm; and wherein the first organic layer is formed of a material comprising one or multiple ones of acrylic, hexamethyldisiloxane, polyacrylate, polycarbonate, and polystyrene; and the first organic layer has a thickness of 0.5 μm-3 μm.

6. The OLED package structure as claimed in claim 5, wherein the stacked arrangement of the plurality of package units comprises at least one package unit the second outer bound confinement layer is set at a location that corresponds vertically to a location of the first outer bound confinement layer, the second outer bound confinement layer having a material and a thickness identical to those of the first outer bound confinement layer; and the second organic layer has a material and a thickness identical to those of the first organic layer.

* * * * *